(12) United States Patent
Ali

(10) Patent No.: US 6,239,661 B1
(45) Date of Patent: May 29, 2001

(54) TRANSMITTER AND AN OSCILLATOR NETWORK FOR USE IN THE TRANSMITTER

(75) Inventor: Danish Ali, South Croydon (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/489,750

(22) Filed: Jan. 21, 2000

(30) Foreign Application Priority Data

Feb. 11, 1999 (GB) ................................... 9903079

(51) Int. Cl.$^7$ ....................................... H03B 5/02
(52) U.S. Cl. .................. 331/57; 331/108 R; 331/108 B; 327/238; 327/254
(58) Field of Search ................... 331/57, 23, 30, 331/34, 107 R, 108 R, 108 B, 108 C; 327/237, 238, 246, 254, 255, 256

(56) References Cited

U.S. PATENT DOCUMENTS

| | | | |
|---|---|---|---|
| 5,446,417 | * 8/1995 | Korhonen et al. | 331/57 |
| 6,008,701 | * 12/1999 | Gilbert | 331/57 |
| 6,137,370 | * 10/2000 | Yamamoto | 331/57 |

* cited by examiner

Primary Examiner—Tuan T. Lam
(74) Attorney, Agent, or Firm—Jack D. Slobod

(57) ABSTRACT

A transmitter having an integratable quadrature oscillator network for simultaneously producing a sine wave and a cosine wave. The digital direction of rotation (whether the frequency is positive or negative) input is slow rate limited (R, C3) and fed into a low gm transconductor (MOS1, MOS2) to softly switch between two pairs of transconductor amplifiers (TR1, TR2 and TR3, TR4) which together with two capacitors (C1, C2) form quadrature oscillators of opposite direction of rotation. By softly switching the quadrature oscillators out-of-band emissions are minimized in a subsequent mixing with a carrier signal to generate a frequency modulated signal.

10 Claims, 1 Drawing Sheet

TRANSMITTER AND AN OSCILLATOR NETWORK FOR USE IN THE TRANSMITTER

Figure 1:
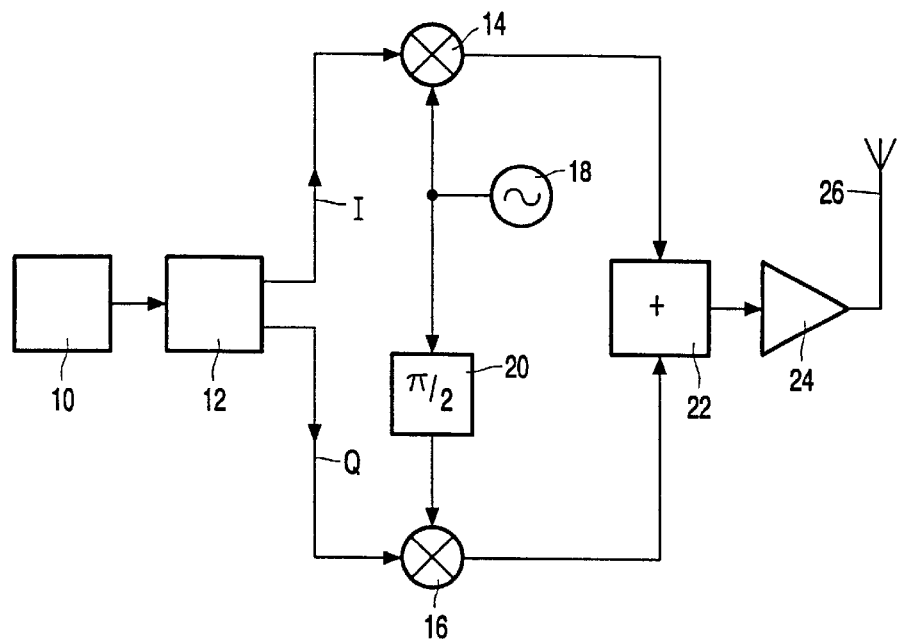

The present invention relates to a transmitter, particularly but not exclusively a zero IF transmitter, and to a quadrature oscillator network generating FSK modulating signals for use in a transmitter.

U.S. Pat. No. 5,489,878 discloses in its preamble an oscillator comprising a non-inverting integrator followed by an inverting integrator, the output of which is coupled back to the input of the non-inverting integrator to form a closed loop. Typically the integrators are implemented as op-amps having a capacitance connected between the output and input of the associated op-amp. The oscillator comprises first and second gm/C integrator stages having common mode biasing means. Each of the gm/C stages comprises a long tail pair circuit in which the tail current is used to tune the oscillator. If such an oscillator is used as the modulating signal in a zero IF transmitter in which the phase of the modulating frequency is switched from positive to negative, an abrupt change will occur in the modulated signal causing the carrier to be spread well beyond its allowable band.

It is an object of the present invention to avoid spreading the carrier when switching the phase of such a type of oscillator.

According to a first aspect of the present invention there is provided a quadrature oscillator comprising a first integratable oscillator comprising a first non-inverting transconductance amplifier having an output connected to a first inverting transconductance amplifier, a second integratable oscillator comprising a second inverting transconductance amplifier having an output connected to a second non-inverting transconductance amplifier, a first capacitance coupled between the outputs of the first non-inverting and second inverting amplifiers and a reference voltage line, a second capacitance coupled between outputs of the first inverting and second non-inverting amplifiers and the reference voltage line, a feedback coupling between the outputs of the first inverting and second non-inverting amplifiers and inputs to the first non-inverting and second inverting amplifiers, a phase rotating circuit comprising means for switching-off one or other of the first and second integratable oscillators, and means coupled to the phase rotating circuit for slew rate limiting a phase setting data input signal applied to the phase rotating circuit.

According to a second aspect of the present invention there is provided a transmitter comprising a quadrature oscillator having outputs for in-phase and quadrature phase signals, first and second mixers, each mixer having a first input coupled to a respective one of the outputs of said oscillator and a second input for a local oscillator signal, means for combining outputs from the first and second mixers and means for propagating the combined signal, wherein the quadrature oscillator comprises a first integratable oscillator comprising a first non-inverting transconductance amplifier having an output connected to a first inverting transconductance amplifier, a second integratable oscillator comprising a second inverting transconductance amplifier having an output connected to a second non-inverting transconductance amplifier, a first capacitance coupled between the outputs of the first non-inverting and second inverting amplifiers and a reference voltage line, a second capacitance coupled between outputs of the first inverting and second non-inverting amplifiers and the reference voltage line, a feedback coupling between the outputs of the first inverting and second non-inverting amplifiers and inputs to the first non-inverting and second inverting amplifiers, a phase rotating circuit comprising means for switching-off one or other of the first and second integratable oscillators, and means coupled to the phase rotating circuit for slew rate limiting a phase setting data input signal applied to the phase rotating circuit.

According to a third aspect of the present invention there is provided an integrated transmitter having the features in accordance with the second aspect of the present invention.

By slew rate limiting the phase setting data input signal, the pairs of transconductance amplifiers which form oscillators of opposite direction of rotation are switched softly from one direction of phase rotation to the other thereby minimising the out-of-band emissions whenever the outputs are mixed with a carrier to generate a frequency modulated signal.

In an embodiment of the present invention the phase rotating circuit comprises a long tail pair circuit having a low transconductance which facilitates the soft switching operation. The low transconductance was achieved by using MOS devices with a low W/L (width to length) ratio. An advantage of the MOS devices being p-channel devices is that first and second current mirror arrangements used for mirroring current from the long tail pair circuit can be arranged at the bottom so that the analogue ground can be set as low as possible for low voltage battery operation. The respective first and second current mirror arrangements duplicate the control currents present in outputs of the long tail pair circuit and ensure that overall to respective first and second integratable oscillators have equal and opposite transconductances.

Figure 2:
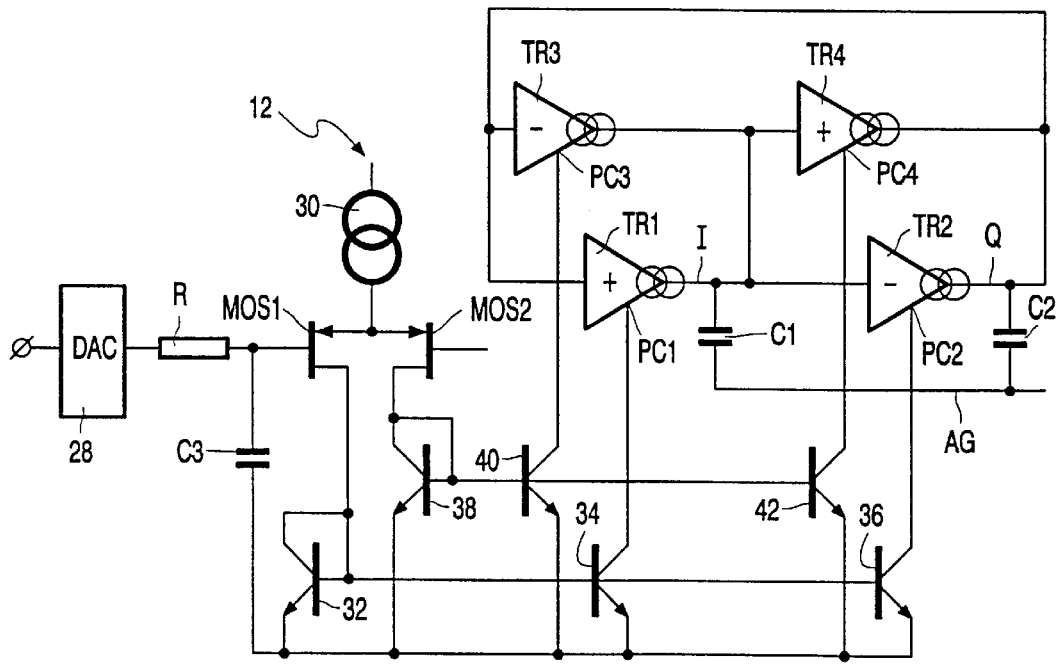

The present invention will now be described by way of example, with reference to the accompanying drawings, wherein:

FIG. 1 is a block schematic diagram of an FSK (frequency shift keyed) transmitter, and FIG. 2 is a diagram, partly schematic, of an oscillator having soft frequency reversal.

In the drawings the same reference numerals have been used to indicate corresponding features.

The transmitter (or transmitter section of a transceiver) shown in FIG. 1 comprises a data source 10, which may comprise a digital signal processor (DSP) in a controller of a telecommunications system, and which provides digital signals for use in modulating a carrier signal. In the case of FSK (frequency shift keyed) modulation, the digital signals are supplied to relatively low frequency oscillator 12 whose phase is rotated clockwise by 90° or anti-clockwise by 90° in response to the digital signals. The outputs of the oscillator 12, which are termed the in-phase (I) and quadrature—phase (Q) signals, are applied to a frequency-up-converter comprising mixers 14, 16, a local oscillator 18 generating the carrier frequency is coupled directly to the mixer 14 and by way of a π/2 phase shifter 20 to the mixer 16. A signal combiner 22 combines the outputs of the mixers 14, 16 and supplies them to a power amplifier 22 which in turn is connected to an antenna 26 for propagating the amplified signal. In operation the amplitudes of the I and Q signals are controlled to ensure that the outputs of the mixers 14 and 16 are linear.

Referring to FIG. 2, the oscillator 12 comprises first and second pairs of transconductance amplifiers TR1, TR2 and TR3, TR4 which with capacitors C1, C2 comprise quadrature oscillators of opposite direction of rotation. The amplifiers TR1 and TR4 have a non-inverting configuration indicated by the plus symbol and the amplifiers TR2 and TR3 have an inverting configuration indicated by the minus sign.

More particularly in the non-inverting configuration an input signal is applied to a non-inverting input of the amplifier whilst the inverting input is connected to analogue ground and the converse is the case with the inverting configuration.

The amplifiers TR1 to TR4 each have an input PC1 to PC4, respectively, for programming current and standby current.

The transconductance amplifiers TR1 to TR4 are connected as follows. The outputs of the amplifiers TR1 and TR3 are coupled respectively to the inputs of the amplifiers TR2 and TR4. The outputs of the amplifiers TR2, TR4 are coupled back to the inputs of the amplifiers TR1, TR3. The outputs of the amplifiers TR1 and TR3 are also coupled together and a capacitor C1 is coupled between the junction and analogue ground AG. Similarly the outputs of the amplifiers TR2, TR4 are coupled by way of another capacitor C2 to the analogue ground AG. The I signal is produced at the outputs of the amplifiers TR1 and TR3 and the Q signal is produced at the outputs of the amplifiers TR2 and TR4.

The clockwise/anti-clockwise rotation of the phasor is implemented using a long tail pair of p-channel MOS transistors MOS1, MOS2. Digital signals used for setting the oscillator direction are applied by way of a digital-to-analogue converter 28 to the gate electrode of the transistor MOS 1 and a logic threshold value is applied to the gate electrode of the transistor MOS 2. A current source 30 is coupled to the common source connection of the transistors MOS 1 and MOS 2 and is used to set the oscillator frequency. The drain current of the transistor MOS1 is mirrored by NPN transistors 32, 34, 36 to the programming current inputs PC1 and PC2 of the amplifiers TR1 and TR2. Similarly the drain current of the transistor MOS2 is mirrored by NPN transistors 38, 40 and 42 to the programming inputs of the amplifiers TR3 and TR4. The p-channel MOS devices MOS1 and MOS2 enable the current mirror arrangements to be at the bottom which allows the line Vee to be set as low as possible for low voltage operation.

An input signal slewing arrangement comprising a series resistor R coupled to the gate of the transistor MOS1 and a shunt capacitance C3 enables the switching of the phasor to be effected softly over a fraction of the bit period, for example between 0.1 and 0.3 of a bit period thereby reducing the risk of spurious out-of-band emissions being produced in the subsequent mixing operations in the mixers 14, 16.

The operation of the oscillator 12 is based on the analogue voltage applied to the gate of the transistor MOS1, which voltage is derived from the digital signals from the data source 10, being either more positive or more negative than the logic threshold voltage applied to the gate of the transistor MOS2.

If the gate of MOS1 is more positive than the gate of MOS2, then the output of MOS1 is high causing a relatively high current to be mirrored to the programming current inputs PC1, PC2 of the transconductance amplifiers TR1 and TR2. The amplifiers TR3 and TR4 can effectively be ignored because only the oscillator formed by the amplifiers TR1 and TR2 is operational. The converse is the case if the gate of MOS1 is more negative than the gate of MOS2 so that the amplifiers TR1 and TR2 can effectively be ignored resulting in the oscillator formed by the amplifiers TR3 and TR4 being operational. Thus the charge on the capacitor C1 varies from positive (TR1 dominating causing the phasor to rotate say clockwise) to negative (TR3 dominating) causing the phasor to rotate say anti-clockwise whilst the charge on the capacitor C2 remains substantially constant.

The oscillator circuit can be fully integrated on a bipolar or bicmos chip even though the frequencies involved are lower than can easily be accommodated by on-chip resistor—capacitor time constants.

In practice the transconductor amplifiers TR1, TR2, TR3 and TR4 would require a large voltage change to turn them off and in order to avoid having to generate such a large voltage change, the nominally off transconductor amplifiers are actually left with a small "standby" tail current having a value about one tenth of its complement.

The values of the capacitors C1, C2 is of the order of a few picofarads (pF) which enables them to be fabricated on chip using an acceptable device area.

In the event of the slew rate limiting components being too large to be included conveniently on-chip, the resistor R may be replaced by a transconductor with a very low maximum drive current in a configuration which can cope with the output saturating at either the positive or negative supply, without for example generating a disruptive amount of substrate current.

In a non-illustrated variant of the oscillator shown in FIG. 2, the transconductors TR1, TR2, TR3 and TR4 have differential inputs and outputs and capacitors are connected across the differential outputs rather than between the outputs and analogue ground AG. Optionally each of the capacitors may comprise 2 capacitors connected back-to-back.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of transmitters, oscillators and component parts thereof and which may be used instead of or in addition to features already described herein.

What is claimed is:

1. A quadrature oscillator comprising a first integratable oscillator comprising a first non-inverting transconductance amplifier having an output connected to a first inverting transconductance amplifier, a second integratable oscillator comprising a second inverting transconductance amplifier having an output connected to a second non-inverting transconductance amplifier, a first capacitance coupled between the outputs of the first non-inverting and second inverting amplifiers and a reference voltage line, a second capacitance coupled between outputs of the first inverting and second non-inverting amplifiers and the reference voltage line, a feedback coupling between the outputs of the first inverting and second non-inverting amplifiers and inputs to the first non-inverting and second inverting amplifiers, a phase rotating circuit comprising means for switching-off one or other of the first and second integratable oscillators, and means coupled to the phase rotating circuit for slew rate limiting a phase setting data input signal applied to the phase rotating circuit.

2. A quadrature oscillator as claimed in claim 1, characterised in that each said amplifier has a respective programming input, in that the phase rotating circuit comprises a long tail pair circuit comprising first and second semiconductor devices having a common current supply and respective outputs, a control electrode of the first semiconductor device being coupled to a threshold circuit and an output electrode of the first semiconductor device being coupled by a first current mirror arrangement to the programming inputs of the second inverting and second non-inverting amplifiers, a control electrode of the second semiconductor device being coupled to means providing the phase setting data input signal and an output electrode of the second device being coupled by a second current mirror arrangement to the programming inputs of the first non-inverting and first inverting amplifiers, and in that the means for slew rate limiting the phase setting data signal is coupled to the control electrode of the second semiconductor device.

3. A quadrature oscillator as claimed in claim 2, characterised in that the long tail pair circuit has a low transconductance.

4. A quadrature oscillator as claimed in claim 2, characterised in that the first and second semiconductor devices comprise MOS devices.

5. A quadrature oscillator as claimed in claim 2, characterised in that the long tail pair circuit comprises p-channel MOS devices having the current mirror arrangements at the bottom which will allow the analogue ground to be set as low as possible for low voltage operation.

6. A quadrature oscillator as claimed in claim 2, characterised in that the slew rate limiting means comprises a resistor coupled to the control electrode of the second semiconductor device and a third shunt capacitance coupled to the control electrode of the semiconductor device.

7. A transmitter comprising a quadrature oscillator having outputs for in-phase and quadrature phase signals, first and second mixers, each mixer having a first input coupled to a respective one of the outputs of said oscillator and a second input for a local oscillator signal, means for combining outputs from the first and second mixers and means for propagating the combined signal, wherein the quadrature oscillator comprises a first integratable oscillator comprising a first non-inverting transconductance amplifier having an output connected to a first inverting transconductance amplifier, a second integratable oscillator comprising a second inverting transconductance amplifier having an output connected to a second non-inverting transconductance amplifier, a first capacitance coupled between the outputs of the first non-inverting and second inverting amplifiers and a reference voltage line, a second capacitance coupled between outputs of the first inverting and second non-inverting amplifiers and the reference voltage line, a feedback coupling between the outputs of the first inverting and second non-inverting amplifiers and inputs to the first non-inverting and second inverting amplifiers, a phase rotating circuit comprising means for switching-off one or other of the first and second integratable oscillators, and means coupled to the phase rotating circuit for slew rate limiting a phase setting data input signal applied to the phase rotating circuit.

8. A transmitter as claimed in claim 7, characterised in that each said amplifier has a respective programming input, in that the phase rotating circuit comprises a long tail pair circuit comprising first and second semiconductor devices having a common current supply and respective outputs, a control electrode of the first semiconductor device being coupled to a threshold circuit and an output electrode of the first semiconductor device being coupled by a first current mirror arrangement to the programming inputs of the second inverting and second non-inverting amplifiers, a control electrode of the second semiconductor device being coupled to means providing a phase setting data input signal and an output electrode of the second device being coupled by a second current mirror arrangement to the programming inputs of the first non-inverting and first inverting amplifiers, and in that the means for slew rate limiting the phase setting data input signal is coupled to the control electrode of the second semiconductor device.

9. A transmitter as claimed in claim 8, characterised in that the long tail pair circuit has a low transconductance.

10. An integrated circuit comprising a transmitter as claimed in claim 7.

* * * * *